United States Patent

Otsuka et al.

[11] Patent Number: 5,975,178
[45] Date of Patent: Nov. 2, 1999

[54] MANUFACTURING METHOD OF FILM CARRIER TAPE, MANUFACTURING APPARATUS OF FILM CARRIER TAPE, AND FILM CARRIER TAPE

[75] Inventors: Masashi Otsuka, Fujisawa; Hiroaki Kishi, Yokohama, both of Japan

[73] Assignee: Kabushiki Kaisha Toshiba, Japan

[21] Appl. No.: 08/939,986

[22] Filed: Sep. 29, 1997

[30] Foreign Application Priority Data

Sep. 30, 1996 [JP] Japan .................................. 8-259202
Sep. 24, 1997 [JP] Japan .................................. 9-259006

[51] Int. Cl.$^6$ ........................... B32B 31/00; B32B 31/20; B32B 31/08
[52] U.S. Cl. ........................... 156/358; 156/64; 156/351; 156/361; 156/378
[58] Field of Search .................. 156/64, 351, 358, 156/361, 378; 425/141

[56] References Cited

U.S. PATENT DOCUMENTS

| | | | |
|---|---|---|---|
| 4,264,397 | 4/1981 | Kawashima et al. | 156/361 |
| 4,571,354 | 2/1986 | Maxwell | 428/78 |
| 4,829,405 | 5/1989 | Snyder | 361/413 |
| 5,061,337 | 10/1991 | Fraser | 156/351 |
| 5,224,264 | 7/1993 | Takahashi et al. | 29/827 |
| 5,417,784 | 5/1995 | Kobayashi et al. | 156/64 |
| 5,470,411 | 11/1995 | Gloton et al. | 156/64 |
| 5,507,903 | 4/1996 | Yamamori et al. | 156/229 |
| 5,656,110 | 8/1997 | Herklotz et al. | 156/64 |

*Primary Examiner*—Richard Crispino
*Assistant Examiner*—Sue A. Purvis
*Attorney, Agent, or Firm*—Finnegan, Henderson, Farabow, Garrett & Dunner, L.L.P.

[57] ABSTRACT

A base film 9 on which a first pattern 31 is formed and a conductive foil 12 on which a second pattern 32 is formed are laminated by being passed through a gap between laminating rolls 7a, 7b which are provided with an adjusting means for adjusting the gap width and parallelism between them. Then, a relative position between the first pattern 31 and the second pattern 32 is detected. After patterning the conductive foil 12 to form a wiring 12w, displacements of the first pattern 31 and the second pattern 32 are detected, and the gap width and parallelism between the laminating rolls 7a, 7b are adjusted corresponding to the detected displacements. Thus, the laminate can be formed uniformly, and the base film 9 and the wiring 12 can be prevented from being deformed with the release of a residual stress in the patterning step. According to the manufacturing method of a high-precision film carrier tape, highly-integrated semiconductor devices are mounted with high productivity.

11 Claims, 7 Drawing Sheets

MANUFACTURING METHOD OF FILM CARRIER TAPE, MANUFACTURING APPARATUS OF FILM CARRIER TAPE, AND FILM CARRIER TAPE

BACKGROUND OF THE INVENTION

1. Field of the Invention

The invention relates to a manufacturing method of a film carrier tape for a TAB (Tape Automated Bonding) technology, and more particularly to a manufacturing method of a film carrier tape which is produced with high productivity and readily under quality controls.

The invention also relates to a film carrier tape to be used for the TAB technology.

2. Description of the Related Art

The TAB technology mounts electronic parts such as semiconductor devices on a long insulating film, which is called a film carrier tape and has a number of wiring patterns formed, by bumps or the like. A package having the semiconductor devices mounted on the film carrier tape is designated as the film carrier package or tape carrier package.

With high integration of the semiconductor device in these years, the size and arrayed pitch of the connection terminals of the semiconductor devices have become fine even further. Accordingly, the film carrier tape on which such semiconductor devices are mounted is also becoming small.

FIG. 5 is a flowchart describing a general manufacturing process of a film carrier tape.

First, a tape-shaped conductive foil such as a copper foil is laminated onto a tape of insulating resin such as polyimide, which has carrying guide holes (sprocket holes) and device holes formed by punching or the like, with an adhesive layer therebetween, and the laminated film is pressed by being passed through rollers into an integrally bonded form.

Then, a resist is applied onto the conductive foil, exposed and developed to etch the exposed portion with a predetermined wiring being covered, thereby forming a wiring pattern. And, the wiring pattern is plated.

Appearance, size and properties are examined, resulting in completing a film carrier tape on which a number of wiring patterns are formed in its longitudinal direction.

As described above, with the high integration of the semiconductor device in these years, the wiring pattern of the film carrier tape has also become fine still further. In the wiring pattern, a mounting pitch of a part, which is called an inner lead, to be connected to the connection terminal of the semiconductor device is made very small. For example, the mounting pitch has become smaller gradually from 100 $\mu$m to 80 $\mu$m, and to 60 $\mu$m.

To improve reliability and productivity of the film carrier package, therefore, it is significant to improve the relative precision between the wiring pattern (especially, the inner lead) and the connection terminal of the semiconductor device. But, it is very hard to achieve satisfactory precision in actuality.

To provide a high-precision film carrier tape, it was conventionally practiced, for example, to control the thickness of an adhesive layer used to adhere a base film and a conductive foil and to monitor the quality of the wiring pattern (lead group) formed by etching. But, such measures were still not enough to produce a film carrier tape having satisfactory precision.

FIG. 6A is a plan view schematically showing the wiring of a film carrier tape in a portion corresponding to a single unit of the wiring. It is seen that a device hole is displaced from its proper location. FIG. 6B is a schematic view showing that inner leads of a conductor wiring were formed as being displaced from the appropriate location.

This film carrier tape is formed of, for example, a base film 91 made of an insulating resin such as polyimide and a wiring 92w formed on the base film 91. Sprocket holes 91s are formed as carrier guide holes on both sides of the base film 91 of the film carrier tape. And, on the base film 91, a device hole 91h is formed as a region where an electronic part such as a semiconductor device or the like is mounted. The wiring 92w is formed by patterning, for example, a conductive foil such as a copper foil, which is laminated with the base film 91, by a photoetching process or the like. And, the wiring has inner leads 92i which are protruded into the device hole, and to mount the semiconductor device on the film carrier tape, the inner leads are connected with connection terminals (not shown) of the semiconductor device. As described above, with the high integration of the semiconductor device, the size and forming pitch of the connection terminals of the semiconductor device are becoming fine even further. As a result, the inner leads 92i of the film carrier tape are also required to be made with high precision.

However, there were disadvantages that the device hole 91h is deformed in shape, the inner leads 92i of the wiring are displaced from the proper location and the like (FIG. 6B).

As described above, the film carrier tape, on which electronic parts such as a highly integrated semiconductor device having the connection terminals with a very fine size and mounting pitch are mounted, has disadvantages that it is hard to produce and poor in productivity. Thus, the conventional film carrier tape and method of manufacturing the same have disadvantages in providing a highly reliable film carrier package with high productivity.

SUMMARY OF THE INVENTION

The invention was achieved to remedy the disadvantages described above. Specifically, the invention aims to provide a manufacturing method of a film carrier tape, which can produce a high-precision and highly reliable film carrier package with high productivity. And, the invention also aims to provide a film carrier tape which is configured to be readily under quality controls and produced with high precision and high productivity.

A manufacturing method of a film carrier tape, a manufacturing apparatus of a film carrier tape, and a film carrier tape of the invention were achieved based on the following knowledge of the inventors. Specifically, the inventors examined the entire manufacturing process of the film carrier tape to find the cause of a displacement between a base film and a wiring pattern.

In manufacturing a film carrier tape, a photoetching process such as a resist masking, etching or the like is required to pattern a conductive foil such as a copper foil laminated with a base film to form a wiring pattern. But, it was found that even if a mask used for the resist masking, exposure to light and development, and etching had a good precision, the wiring pattern formed is poor in precision if the conductive foil was not laminated with the base film under uniform stress. It was also found that the displacement between a base film and a wiring pattern was caused in the process of patterning the conductive foil which was laminated with the base film. This displacement in the patterning process was presumably concluded to be caused by a stress remaining in the laminated base film and conductive foil due to an uneven pressure applied by a pair of rolls through which the base film and the conductive foil were laminated. Specifically, it was found that since the base film and the conductive foil are very thin and cannot be pressed under a uniform load if the rolls do not have a uniform gap, parallelism and rotating speed therebetween, a residual stress is distributed over the laminate due to the uneven application of pressure. Accordingly, the residual stress in the region where the conductive foil was removed is released by partially removing the conductive foil by etching or the like to form the wiring pattern from the laminate having the distributed residual stress. At this time, a displacement is also caused in the wiring layer due to deformation of the base film. For example, the inner leads are given an increased interval or tilted. Thus, when the wiring pattern becomes poor in precision, the wiring pattern formed on the film carrier tape does not correspond with the connection terminals of the semiconductor device mounted on the film carrier tape, and the reliability of the film carrier tape is deteriorated. Besides, when the stress remained in the film carrier tape is released with a lapse of time, a stress is applied between the inner leads and the connection terminals of the semiconductor device with a lapse of time, deteriorating the reliability of the semiconductor package.

The invention was achieved to remedy the disadvantage of displacement of the film carrier tape resulting from the multiple manufacturing processes as described above.

A first aspect of the manufacturing method of a film carrier tape of the invention is a manufacturing method of a film carrier tape having a base film and a wiring formed on the base film, which comprises steps of laminating the base film and a conductive foil; putting at least three points of marks onto the base film and conductive foil; patterning the conductive foil so that the wiring is formed; and judging whether displacements of the base film and the wiring pattern through the patterning are within a permissible limit or not by measuring a distance between respective marks.

The marks are formed so that two-dimensional displacements between the base film and the wiring can be detected. For example, at least three points of marks can be formed on the base film to detect displacements in the direction of x-y in a region where the base film is present.

And, the marks may be formed so that the marks and the wiring are close. By forming the marks for detecting the displacements of the base film from the conductive foil or the wiring pattern in the neighborhood of the wiring pattern, precision of detecting the displacements can be improved. Especially, the inner leads which are required to have high precision can be kept precise by forming the marks close to the inner leads of the wiring pattern.

The marks may be formed prior to the laminating process. By forming the marks to detect displacements before the base film and the conductive foil are laminated, the displacements of the base film and the wiring pattern due to the uneven pressure during laminating can be detected effectively.

A second aspect of the film carrier tape of the invention is a manufacturing method of a film carrier tape, which comprises steps of laminating a base film and a conductive foil by putting the base film and the conductive foil through a gap between a pair of rolls rotating; and patterning the conductive foil so that wiring is formed; wherein the manufacturing method further comprises steps of forming at least a first pattern onto the base film before patterning the conductive foil; forming at least a second pattern onto the conductive foil before patterning so that a relative location between the first pattern and the second pattern is defined; detecting displacements of the relative location between the first pattern and the second pattern after patterning the conductive foil; and adjusting the gap between the rolls corresponding to the detected displacements between the first pattern and the second pattern.

As described above, the first pattern and the second pattern may be formed so that two-dimensional displacements between the base film and the wiring can be detected. For example, at least three points of the first pattern and the second pattern can be formed, so that the displacements of the relative location between the base film and the conductive foil are detected with ease.

The second pattern may be formed at the step of patterning the conductive foil. For example, the second pattern may be formed at the step of patterning the conductive foil to form the wiring. And, the second pattern may be formed before the conductive foil is patterned into the wiring. For example, the second pattern may be formed by perforating or the like before laminating the base film with the conductive foil.

And, the second pattern may be formed so that the wiring and the second pattern are close. Thus, precision of the wiring can be improved. Especially, the inner leads which are required to have high precision can be detected for displacements effectively by forming the second pattern close to the inner leads.

In the manufacturing method of a film carrier tape of the invention, the first pattern and the second pattern are formed, the displacements between the first pattern and the second pattern are detected after the patterning step, and the gap and parallelism between the rolls are adjusted corresponding to the detected displacements, so that a high-precision film carrier tape can be provided which has just a minute displacement between the base film and the wiring. In other words, the invention detects displacements between the first pattern and the second pattern, feeds back the detected displacements to the laminating step using the rolls until the positional displacements are minimized in the laminating step, and determines the laminating conditions accordingly. By repeating the feedback until the displacements between the first pattern and the second pattern are minimized, the base film and the conductive foil can be laminated uniformly. Thus, the residual stress is reduced, the deformations of the base film and the wiring can be minimized, and the high-precision film carrier tape can be manufactured with high productivity.

The first pattern and the second pattern may be formed at multiple locations on a long tape of, for example, tens of meters as required. For example, both the first pattern and the second pattern may be formed at the starting end portion, the terminating end portion, and the middle of the starting and terminating end portions of the tape. And, the first pattern and the second pattern may be formed corresponding to the respective wiring patterns formed in multiple lines on a long tape.

A third aspect of the invention is a manufacturing apparatus for manufacturing a film carrier tape having a base film and a wiring formed on the base film, which comprises means for forming a first pattern on the base film; means for forming a second pattern onto the conductive foil, and a relative location between the first pattern and the second pattern is defined; a pair of rolls having a gap laminating the base film and the conductive foil; means for patterning the conductive foil laminated on the base film; means for detecting displacements of a relative location between the first pattern on the base film and the second pattern on the conductive foil; and means for adjusting the gap between the rolls corresponding to the detected displacements.

By referring to the first pattern and the second pattern formed as an alignment pattern, the displaced level in position due to the pressure and rotating speed in the laminating step can be detected in the patterning step, and the gap between the rolls and the rotating speeds in the laminating step can be adjusted corresponding to the detected displacements. By feeding back the detected displacements to determine the laminating conditions of the laminating step, the base film and the conductive foil can be laminated uniformly. Therefore, the residual stress can be reduced, and the deformation of the base film and the wiring can be minimized, so that a high-precision film carrier tape can be manufactured.

A fourth aspect of the invention is a film carrier tape which comprises a base film; a wiring formed on the base film; and at least three points of marks formed on the base film which are closed to the wiring, and relative locations of the marks are defined.

At least three points of patterns for detecting displacements in the invention may be formed in the neighborhood of the wiring, for example, between a plurality of inner leads next to device holes. And, the displacement detecting patterns may be perforations formed on the insulating tape, patterns formed on a metallic foil, or a combination thereof. The displacement detecting patterns are preferably formed away from one another in order to judge the degradation of precision due to releasing of the residual stress after patterning the conductive foil to form the wiring in view of the relative displacements of the displacement detecting marks. The displacement detecting patterns may be formed into any form such as a circular or a square. And, the displacement detecting pattern is not required to be formed for each wiring. In other words, the displacement detecting pattern may be formed on at least one inner lead wiring, though the wiring is formed in lines in a plural unit on the film carrier tape.

The lamination of the base film having carrier guide holes and a tape-shaped conductive foil in the invention has generally a three-layered structure with an adhesive layer held between them. But, when the base film fuses to become adhesive while the laminate is passed under pressure through the rolls, the laminate may have a two-layered structure with the adhesive layer omitted.

Prior to the laminating step, the patterns for detecting the relative displacements are formed on both ends of at least one of the base film and the tape-shaped conductive foil, and also preferably at the middle, as required. Specifically, in order to detect whether the base film and the tape-shaped conductive foil are laminated under substantially the uniform stress in view of the relative displacements of the plurality of previously perforated holes, the detecting patterns are required to be formed in a region of starting and a region of terminating the lamination (on both ends) of at least one of the base film or the tape-shaped conductive foil.

As described above, the displacement detecting patterns formed on the base film and the tape-shaped conductive foil are used to detect the displacements of the wiring containing the inner leads upon the release of the residual stress in view of the extent of the relative displacements, and the detected displacements are fed back to the laminating step. And, it is preferable that the displacement detecting patterns are formed separately on the base film and the tape-shaped conductive foil and also adjacent to each other.

The invention forms on the base film and the tape-shaped conductive foil a pattern for detecting the relative displacements of such tape-shaped members. But, trial patterning (perforating, etching or the like) may be performed on at least the starting end portion and the terminating end portion of a long tape having the laminated structure to detect the displacements of the wiring containing the inner leads when the residual stress due to the patterning is released, and the detected displacements may be fed back to the laminating step.

DESCRIPTION OF THE PREFERRED EMBODIMENTS

The invention will be described in detail with reference to the accompanying drawings.

Figure 1A:
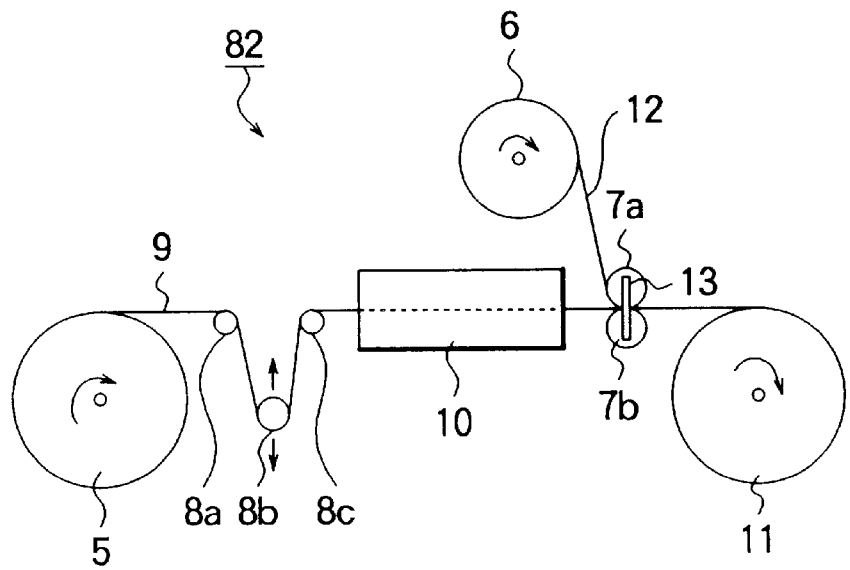
FIG. 1A and FIG. 1B are diagrams illustrating a manufacturing method of a film carrier tape of the invention.
Figure 1B:
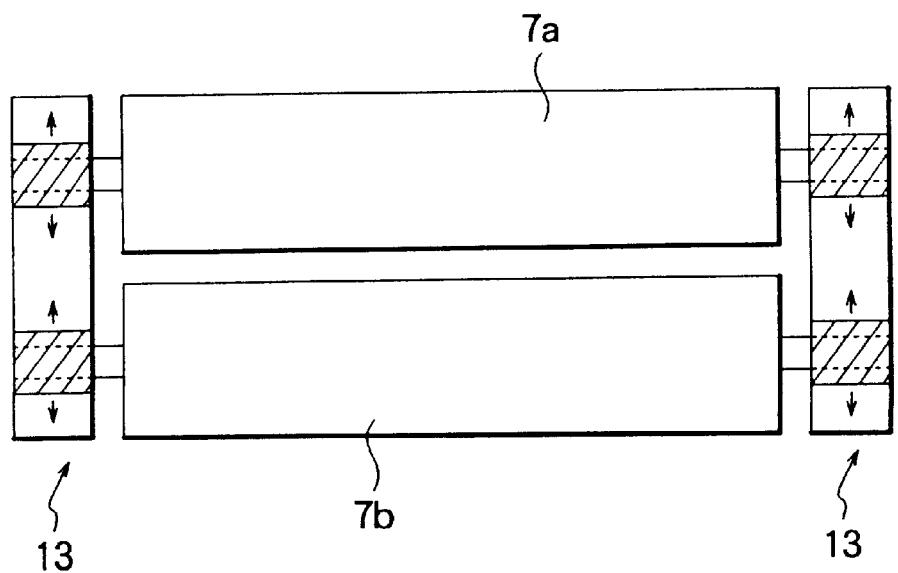

Embodiment 1:

FIG. 1A and FIG. 1B are diagrams to illustrate a manufacturing method of a film carrier tape, showing that a base film 9 and a conductive foil 12 such as a copper coil are laminated by a laminating apparatus provided with a pair of laminating rolls 7a, 7b.

The apparatus shown in FIG. 1A provides a feed roll 5 supplying the base film 9 having sprocket holes 9s (guide holes for carrying), a feed roll 6 supplying the tape-shaped conductive foil 12, laminating rolls 7a, 7b laminating the base film 9 and the conductive foil 12, and a take-up roll 11 taking up the base film 9 and the conductive foil 12 in the laminated form. Guide rolls 8a, 8b, and 8c adjusting the tension of the base film 9 being supplied, and a preheating oven 10 (preheating zone) for preheating the base film are also provided.

FIG. 1B is a schematic diagram showing the structure of the laminating rolls.

The laminating rolls 7a, 7b are disposed with rotating shafts held substantially in parallel. The base film 9 and the conductive foil 12 are contact-bonded under pressure through the gap between the laminating roll 7a and the laminating roll 7b. The gap and parallelism between the laminating roll 7a and the laminating roll 7b are controlled by adjusting the positions of the rotating shafts by means of adjusters 13. And, the laminating roll 7a and the laminating roll 7b are driven to rotate by a drive means (not shown) In FIG. 1B, the rotating shafts with both ends supported are shown, but a cantilever-type laminating roll which has a rotating shaft supported by one side only may be used.

The base film 9 has an adhesive layer (not shown) on its side opposed to the conductive foil 12. And, a lead at the leading end of the base film 9 is fitted to the take-up roll 11.

Figure 2:
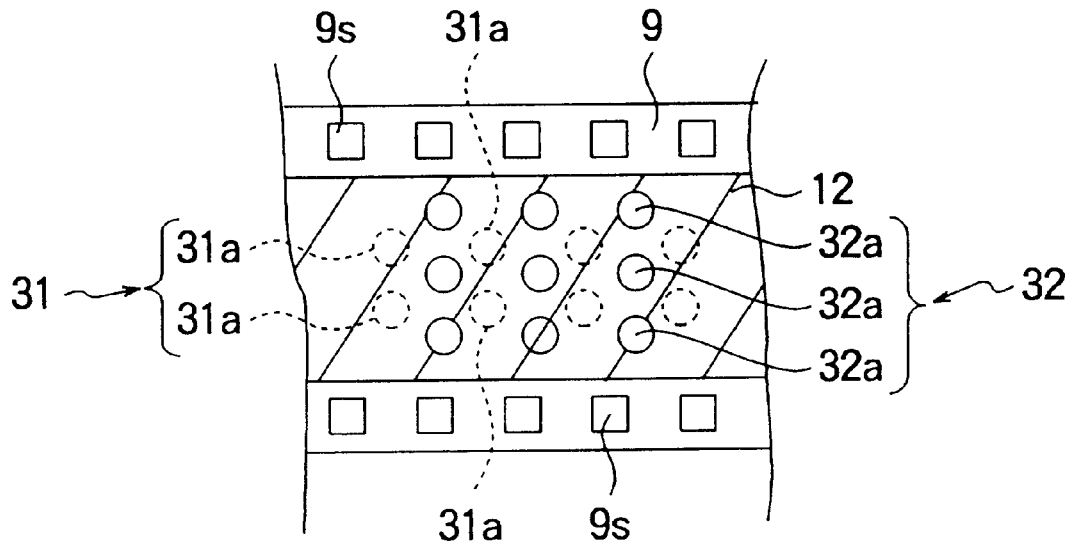
FIG. 2 is a schematic view of one embodiment of the configuration of a film carrier tape of the invention provided with marks for detecting displacements.

A, a first pattern and a second pattern are formed on the end of the base film 9 connected to the lead and the end of the conductive foil 12 laminated with it respectively, so that relative displacements between the base film 9 and the conductive foil 12 can be detected. FIG. 2 is a schematic diagram showing examples of the first pattern and the second pattern. The first pattern 31 comprises a plurality of circular holes 31a which are formed on the base film 9, and the second pattern 32 comprises a plurality of circular holes 32a which are formed on the conductive foil 12. The first pattern 31 and the second pattern 32 are formed at intervals so that their displacements can be detected in the subsequent patterning step or the like. The first pattern 31 which is formed to detect the displacements is formed on the starting end portion, the terminating end portion and substantially the middle portion between them of the base film 9. Similarly, the second pattern 32 is formed on the starting end portion, the terminating end portion and substantially the middle portion between them of the conductive foil 12.

The tape-shaped base film 9 supplied from the feed roll 5 has its tension adjusted by the guide rolls 8a, 8b and 8c, is preheated to about 100° C. by the preheating zone 10, and is sent into the gap between the laminating rolls 7a, 7b. The tape-shaped conductive foil 12 supplied from the feed roll 6 is also sent into the gap between the laminating rolls 7a, 7b so as to be pressed into one body with the base film 9 between them. As will be described afterward, for example, after detecting the displacements of the first pattern 31 and the second pattern 32 after the patterning step, the gap between the laminating rolls 7a, 7b is preferably adjusted corresponding to the detected displacements. Similarly, the preheating temperature and the tension of the base film may also be adjusted.

By configuring as described above, the base film 9 and the conductive foil 12 can be laminated uniformly in the laminating step to manufacture the film carrier tape. In practice, the first pattern 31 and the second pattern 32 are respectively formed on the starting end portion, the terminating end portion and substantially the middle between them of the base film 9 and of the conductive foil 12, the parallelism between the laminating rolls 7a, 7b is adjusted corresponding to the displacements detected after patterning, and the displacements caused between the base film 9 and the wiring formed by patterning the conductive foil 12 in the patterning step can be reduced, so that a high-precision film carrier tape can be manufactured.

The first pattern and the second pattern described above were formed of circular holes disposed at predetermined intervals but may be formed of other shapes.

Figure 3:
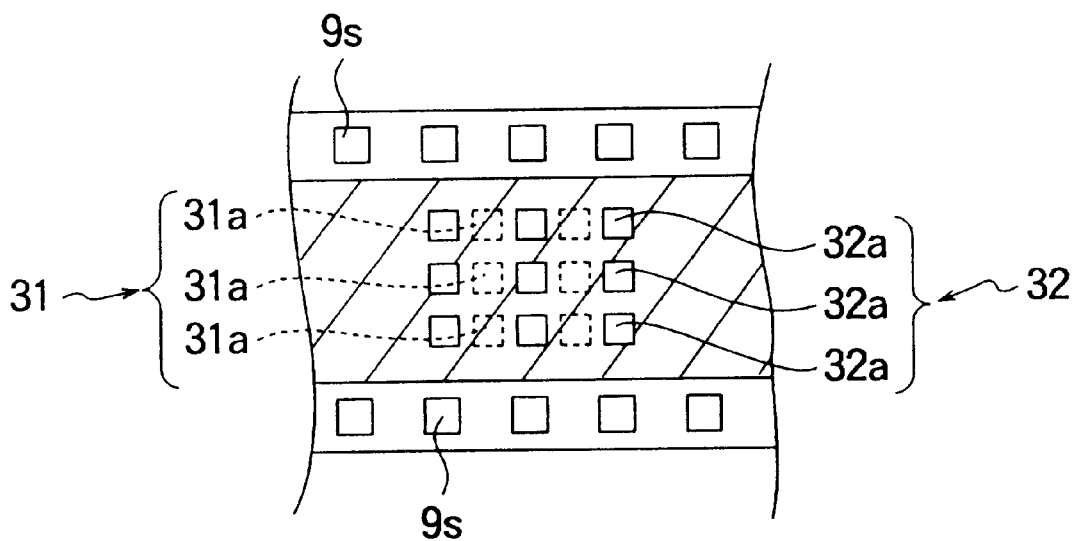
FIG. 3 is a schematic diagram of another embodiment of the configuration of a film carrier tape of the invention which is provided with marks for detecting displacements.

FIG. 3 is a schematic diagram showing another embodiment of the first pattern and the second pattern. It is seen that the first pattern 31 is formed of a plurality of square holes 31a formed on the base film 9 and the second pattern 32 is formed of a plurality of square holes 32a formed on the conductive foil 12. The first pattern 31 and the second pattern 32 are formed at intervals so that their displacements can be detected in the subsequent patterning step or the like.

In the above case, the first pattern 31 was formed on the base film 9 and the second pattern 32 was formed on the conductive foil 12. But, such a pattern for detecting the displacements of the base film 9 and the conductive foil 12 may be formed on at least one of them. However, detection of displacements can be facilitated by forming the pattern on both the base film 9 and the conductive foil 12.

In the above embodiment, the first pattern 31 and the second pattern 32 were previously formed on the base film 9 and the conductive foil 12 which were to be laminated. In addition, the following procedure can be taken. Specifically, the regions on the starting end, the terminating end and the middle between them of the conductive foil 12 which is laminated with the base film 9 by a conventional method may be partially photo-etched to form the second pattern 32. By configuring in this way, precision of the wiring having fine inner leads formed by photoetching or the like can be improved in accordance with the displacement directions and displacement magnitudes of a relative location between the first pattern 31 and the second pattern 32. And, by feeding back the detected displacement directions and displacement magnitudes to the laminating step, productivity is improved, and a high-precision film carrier tape can be manufactured.

Figure 4:
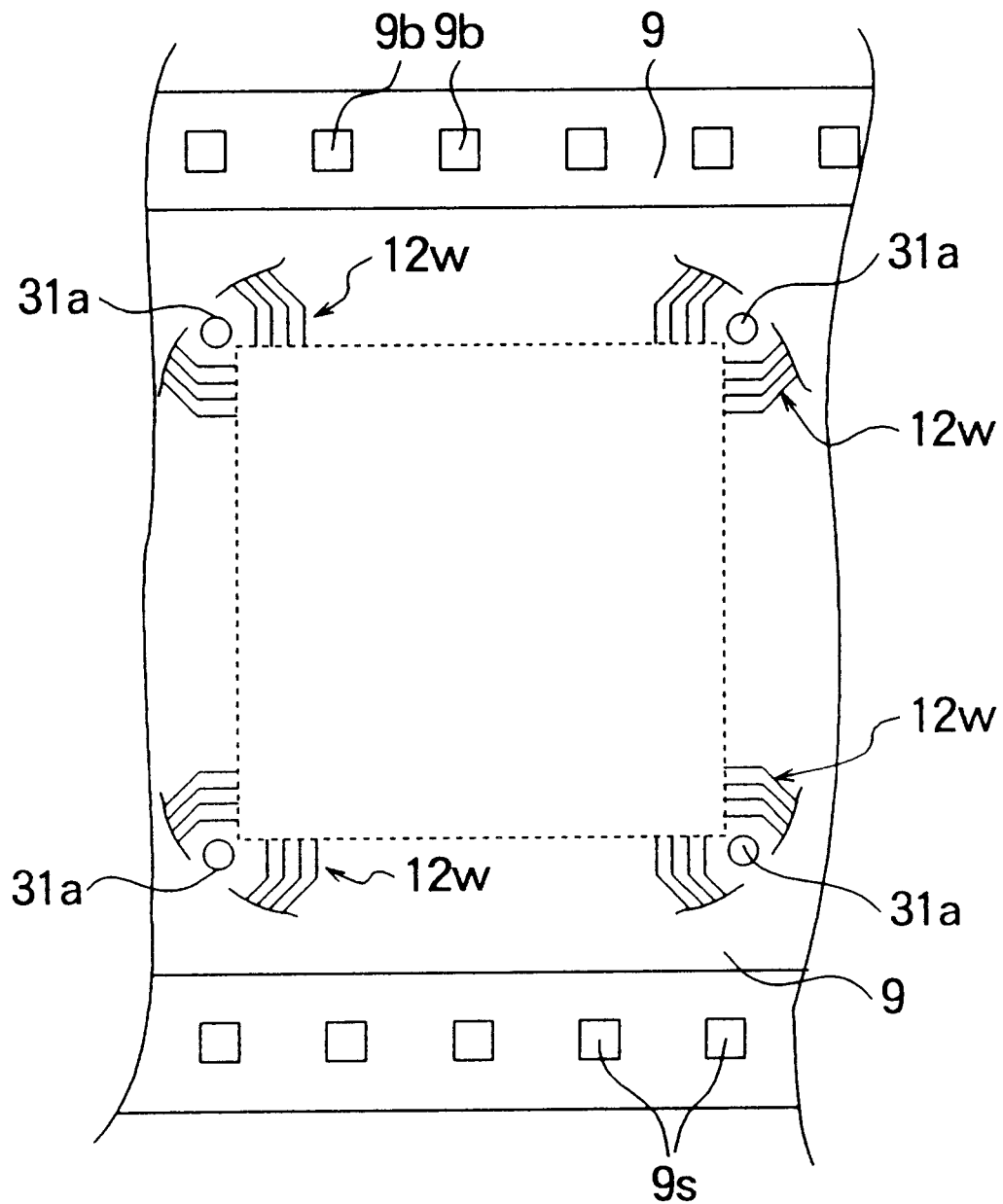
FIG. 4 is a schematic diagram of one embodiment of a film carrier tape of the invention which is provided with marks for detecting displacements in the neighborhood of inner leads.
Figure 5:
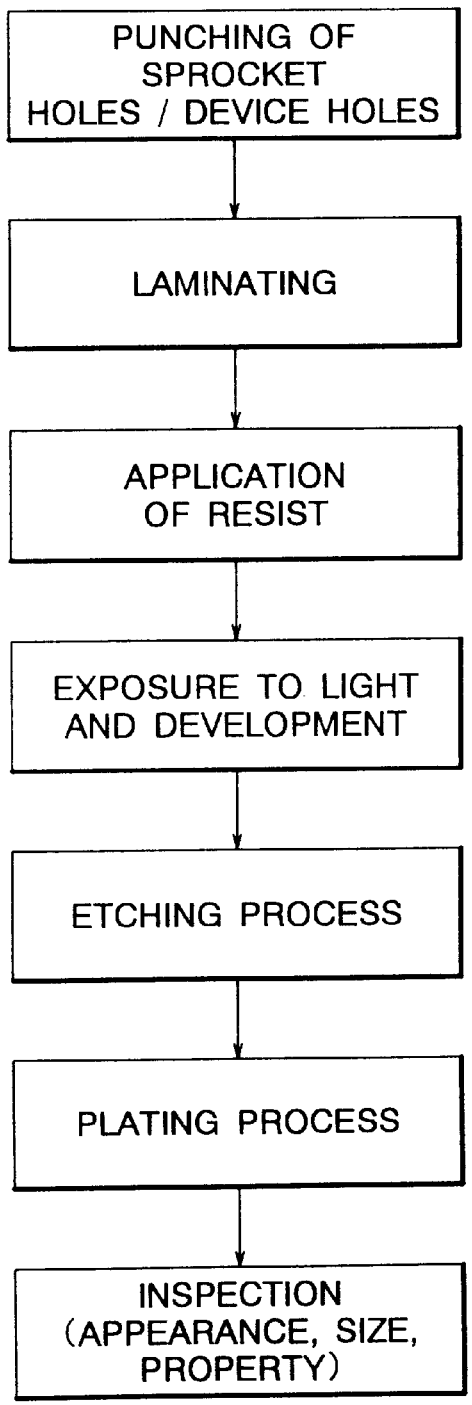
FIG. 5 is an explanatory diagram of the manufacturing step of a conventional film carrier tape.
Figure 6A:
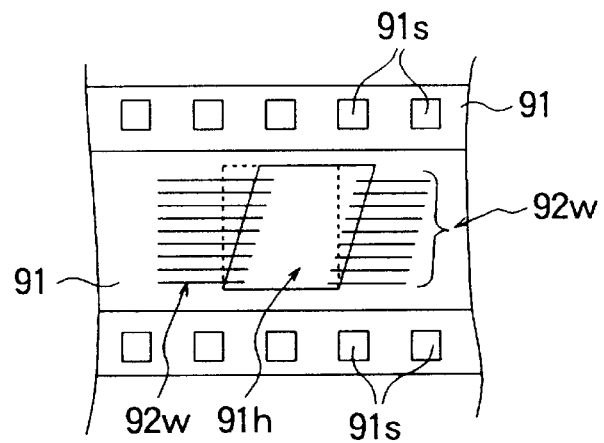
FIG. 6A and FIG. 6B are schematic diagrams of the configuration of a conventional film carrier tape.
Figure 6B:
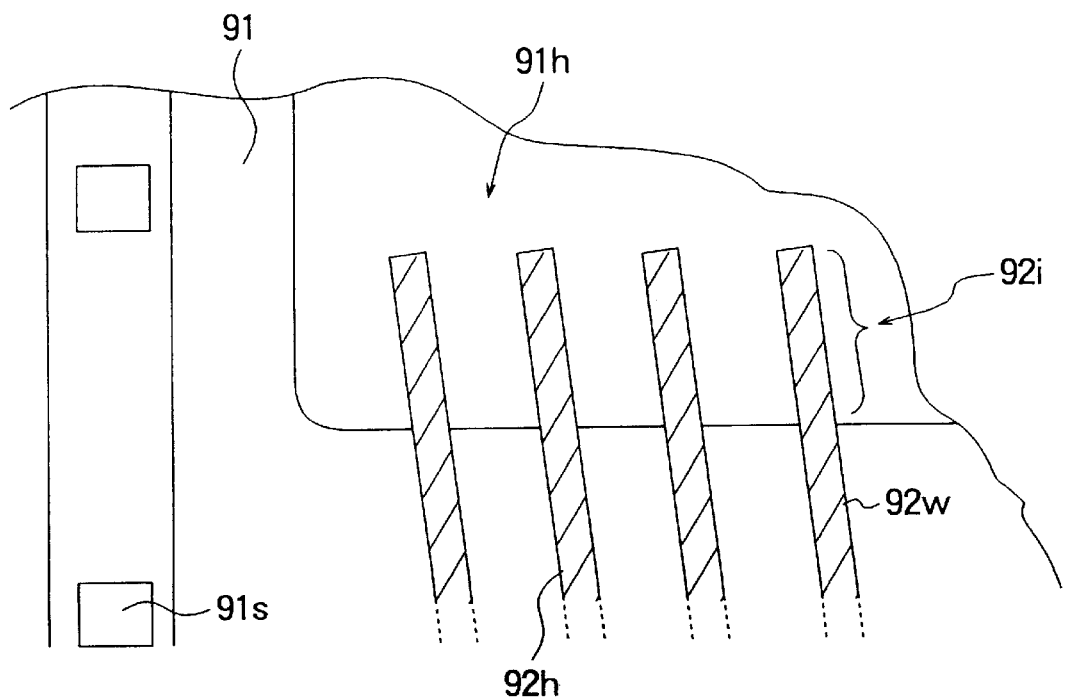

As described above, the invention is based on the finding that the residual stress produced in a laminate due to an uneven pressure when the base film and the conductive foil are laminated is partially released while patterning, and precision of the wiring is degraded. And, the marks are formed in advance on the base film and the conductive foil respectively, and after patterning, deformation of the base film, deformation of the conductive foil and relative displacements of the base film and the conductive foil are detected in view of the locations of the marks. Besides, by feeding back the detected displacements of the marks to the laminating step to adjust, for example, the parallelism and gap size between the laminating rolls, a high-precision film carrier tape can be manufactured with high productivity.
Embodiment 2:

FIG. 4 is a schematic diagram showing the first pattern 31 which is formed in the neighborhood of inner leads of a wiring 12w. By forming marks for detecting displacements in the neighborhood of the inner leads of the wiring pattern 12w, precision of the inner leads of the respective wiring can be judged in view of the displacement magnitude of the marks. Therefore, precision of the inner leads which are especially required to have high precision can be improved. In addition, a film carrier tape poor in precision can be removed, for example, before mounting the semiconductor device, and productivity of a film carrier package produced with the semiconductor device mounted on a film carrier tape can be improved remarkably. But, it is desirable that the marks are formed so not to affect the strength around the inner leads and the connection reliability.

Figure 7:
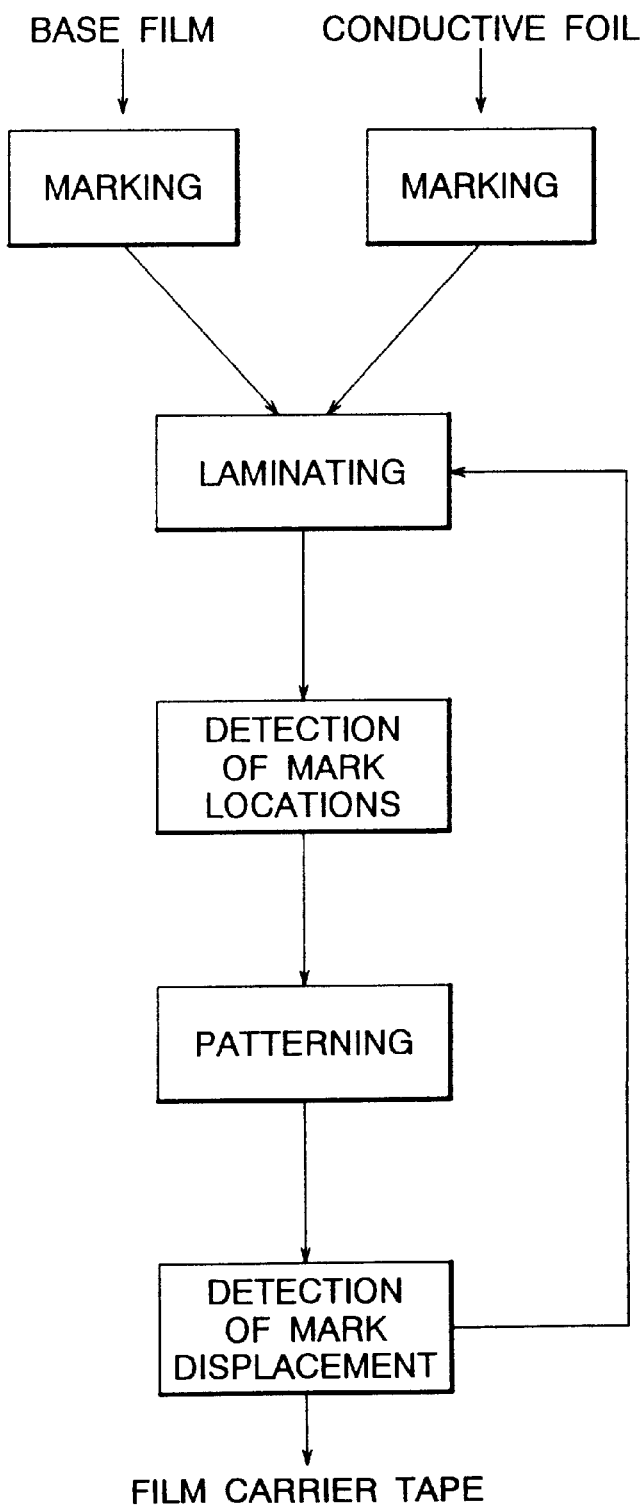
FIG. 7 is an explanatory diagram of a manufacturing method of a film carrier tape of the invention.

The pattern for detecting displacements may be a circular, square, ellipse or the like, and may be formed at multiple points in the middle of the tape in addition to the starting end portion and the terminating end portion of the tape. And, in addition to the three-layered structure including the adhesive layer, the film carrier tape may be configured into a two-layered type without including the adhesive layer.
Embodiment 3:

FIG. 7 is a flowchart illustrating a manufacturing method of a film carrier tape of the invention.

As described above, the invention is based on the finding that the residual stress produced in the laminate due to an uneven pressure when the base film and the conductive foil are laminated is partially released while patterning, and precision of the wiring is degraded. And, the marks are formed in advance on the base film and the conductive foil respectively, and after patterning, deformation of the base film, deformation of the conductive foil and relative displacements of the base film and the conductive foil are detected in view of the locations of the marks. Besides, by feeding back the detected displacements of the marks to the laminating step to adjust, for example, the parallelism and gap size between the laminating rolls, a high-precision film carrier tape can be manufactured with high productivity.

First, the marks for detecting positions are formed on the base film and the conductive foil. The first pattern is formed on the base film as described above, and the second pattern is formed on the conductive foil. The marks formed may be any types if the displacements of a relative location between the first pattern and the second pattern can be detected before and after patterning.

Then, the base film 9 and the conductive foil 12 are laminated into one body by the laminating rolls 7a, 7b as described above. The conditions such as the gap, parallelism, and rotating speed of the laminating rolls 7a, 7b may be controlled by a control device.

It is designed that after laminating and before patterning, the positional relationship between respective points of the first pattern 31, the positional relationship between respective points of the second pattern 32, or the relative positional relationship between the first pattern 31 and the second pattern 32 is detected. And, this detection can be made by a general position detecting device.

After fixing the relative positional relationship between the first pattern 31 and the second pattern 32, the conductive foil is patterned into the wiring. At this time, the conductive foil is preferably patterned to allow the second pattern to remain on the conductive foil.

After patterning, displacement of the first pattern 31, displacement of the second pattern 32, or relative displacement of the first pattern 31 and the second pattern 32 is detected. The first pattern 31 and the second pattern 32 can be formed on at least three positions, so that the base film or the conductive foil can be detected for its deformation before and after patterning. And it is also possible to detect the displacement of the second pattern 32 with respect to the first pattern 31 and vice versa.

The detected displacements of the first pattern or the second pattern before or after patterning are due to the uneven pressure in the laminating step. Therefore, by adjusting the laminating conditions, for example, the gap width, parallelism and the like between the laminating rolls 7a, 7b in the laminating step corresponding to the detected displacements (displacement directions and displacement magnitudes) of the first pattern 31 or the second pattern 32, the film carrier tape can be manufactured under the conditions that the displacements of the first pattern 31 and the second pattern 32 are minimized. Therefore, a high-precision film carrier tape can be manufactured with high productivity.

Figure 8:
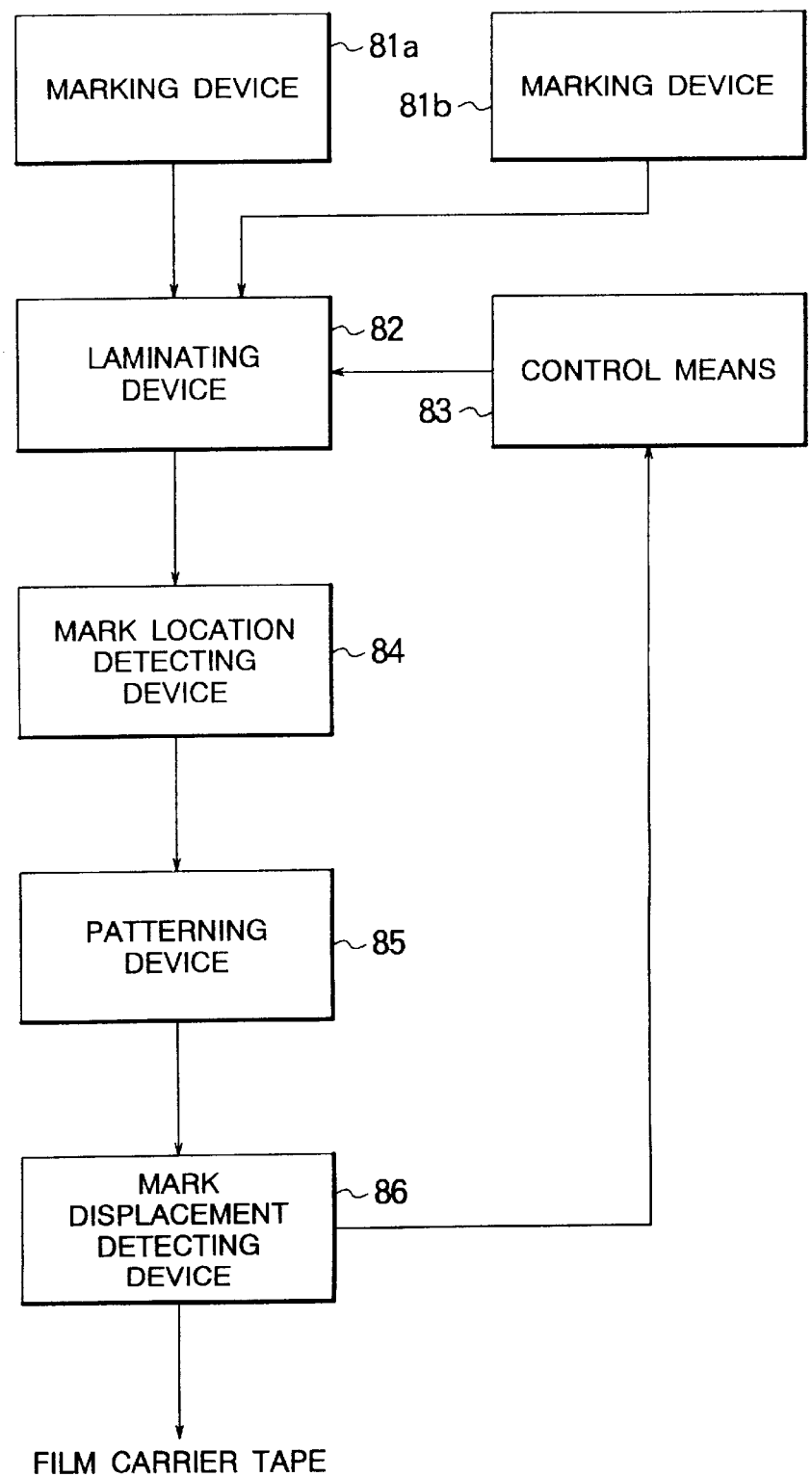
FIG. 8 is a schematic diagram of the structure of a manufacturing apparatus for manufacturing a film carrier tape of the invention.

Embodiment 4:

FIG. 8 is a schematic diagram showing the structure of a manufacturing apparatus for manufacturing a film carrier tape of the invention.

In the manufacturing apparatus for manufacturing a film carrier tape, the first pattern 31 is formed on the base film 9 by a first marking device 81a, and the second pattern 32 is formed on the conductive foil 12 by a second marking device 81b. The marking device may be, for example, a punching device. The first pattern 31 and the second pattern 32 may be formed by the same marking device. And, the first pattern 31 and the second pattern 32 are preferably formed so not to overlap mutually when the base film and the conductive foil are laminated so that displacements of their positions can be detected accurately.

The base film 9 on which the first pattern 31 is formed and the conductive foil 12 on which the second pattern 32 is formed are press-bonded by a laminating device 82. The laminating device may be configured as described in connection with FIG. 1A and FIG. 1B. Specifically, the base film 9 and the conductive foil 12 are put through the gap between the pair of laminating rolls 7a, 7b so to be laminated into one body. The gap size and parallelism between the laminating rolls 7a, 7b are adjusted by adjusters 13 (see Embodiment 1). The adjuster 13 may be operated manually or operated automatically corresponding to external input by having a control means 83 including a servo motor, a step motor or the like.

Subsequent to the laminating device 82, a location detecting means 84 is disposed to detect a relative location between the first pattern 31 of the base film 9 and the second pattern 32 of the conductive foil 12 of the laminate.

The base film 9 and the conductive foil 12 of the laminate are patterned to have a predetermined wiring 12w by photoetching by means of a patterning device 85 which includes a resist applying device, an exposing device, a developing device, and an etching device.

And, in the manufacturing apparatus for manufacturing a film carrier tape of the invention, subsequent to the patterning device 85, a displacement detecting device 86 is disposed to detect displacements of a relative location between the first pattern 31 and the second pattern 32 before and after patterning, for example, displacement directions and displacement magnitudes with respect to the locations of the first pattern 31 and the second pattern 32 fixed before patterning. The displacement detecting device 86 may be designed to determine the displacement direction and displacement magnitude of the second pattern 32 with respect to a coordinate system with at least three points in the first pattern 31 as the reference, or the displacements (displacement directions and displacement magnitudes) of the first pattern 31 with respect to a coordinate system with at least three points in the second pattern 32 as the reference. And, the displacements of the first pattern 31 or the second pattern 32 may be detected.

The determined displacement directions and displacement magnitudes of the first pattern 31 and the second pattern 32 correspond to the distribution of a residual stress produced while laminating. Therefore, the displacements of the first pattern 31 and the second pattern 32 can be minimized by adjusting the gap size and parallelism between the laminating rolls 7a, 7b corresponding to the detected displacements of the first pattern 31 and the second pattern 32. For example, the detected displacements may be fed back to the adjuster 13 of the laminating rolls. Therefore, the manufacturing apparatus for manufacturing a film carrier tape of the invention can manufacture a high-precision film carrier tape with high productivity.

As described above, the manufacturing method of a film carrier tape of the invention forms the marks on the base film or the conductive foil so to enable the detection of displacements before and after patterning, feeds back the displacements detected after patterning to the laminating step, and produces a high-precision film carrier tape with high productivity. And, since the precision of the wiring (especially, the inner leads) of the film carrier tape can be known by detecting the displacements of the marks before mounting the semiconductor device or the like, the semiconductor chip can be mounted and determined corresponding to the precision. In other words, a highly reliable tape carrier package can be proved at high yield.

And, the manufacturing apparatus for manufacturing a film carrier tape of the invention has a means for forming marks on the base film or the conductive foil to detect the positions, detects displacements of the marks before and after patterning, adjusts the gap, parallelism, rotating speed and the like of the laminating rolls corresponding to the detected displacements, and manufactures a high-precision film carrier tape with high productivity.

Furthermore, the film carrier tape of the invention is especially given the marks for detecting the displacements in the neighborhood of the inner leads of the wiring, so that quality control is easy, and productivity can be improved.

What is claimed is:

1. A manufacturing method of a film carrier tape having a base film and a wiring formed on the base film, comprising steps of:

laminating the base film and a conductive foil;

putting at least three points of marks onto the base film and the conductive foil;

after putting the marks, etching the conductive foil so that the wiring is formed; and after the etching, judging whether displacements of the base film and the wiring pattern are within a permissible limit by measuring a distance between respective marks, wherein a pressing force of the laminating is adjusted corresponding to measured displacements of the respective marks before and after the etching.

2. A manufacturing method of a film carrier tape as set forth in claim 1, wherein the marks are formed so that two dimensional displacements between the base film and the wiring are detected.

3. A manufacturing method of a film carrier tape as set forth in claim 1, wherein the marks are formed so that the marks and the wiring are close.

4. A manufacturing method of a film carrier tape as set forth in claim 1, wherein the marks are formed before laminating the base film and the conductive foil.

5. A manufacturing method as set forth in claim 1, wherein the base film and the conductive foil each have an end portion, and the marks are put onto at least the end portions of the base film and conductive foil.

6. A manufacturing method of a film carrier, comprising steps of:

laminating a base film and a conductive foil by putting the base film and the conductive foil through a gap between a pair of rotating rolls; and patterning the conductive foil so that a wiring is formed;

wherein the manufacturing method further comprising steps of:

forming at least a first pattern onto the base film before patterning the conductive foil;

forming at least a second pattern onto the conductive foil before patterning the conductive foil so that a relative location between the first pattern and the second pattern is defined;

detecting displacements of the relative location between the first pattern and the second pattern after patterning the conductive foil; and adjusting the gap between the rolls corresponding to the detected displacements between the first pattern and the second pattern.

7. A manufacturing method of a film carrier tape as set forth in claim 6, wherein the first pattern and the second pattern are formed so that two dimensional displacements between the base film and the wiring are detected.

8. A manufacturing method of a film carrier tape as set forth in claim 7, wherein the first pattern and the second pattern have at least three points of marks.

9. A manufacturing method of a film carrier tape as set forth in claim 6, wherein the second pattern is formed at the step of patterning the conductive foil.

10. A manufacturing method of a film carrier tape as set forth in claim 6, wherein the second pattern is formed before the conductive foil is patterned into the wiring.

11. A manufacturing method of a film carrier tape as set forth in claim 6, wherein the second pattern is formed so that the wiring and the second pattern are close.

* * * * *

UNITED STATES PATENT AND TRADEMARK OFFICE
CERTIFICATE OF CORRECTION

PATENT NO.: 5,975,178

DATED: November 2, 1999

INVENTOR(S): Masashi Otsuka et al.

It is certified that an error appears in the above-identified patent and that said Letters Patent is hereby corrected as shown below:

Claim 6, column 12, line 10, change "comprising" to --comprises the--.

Signed and Sealed this

First Day of August, 2000

Attest:

Q. TODD DICKINSON

*Attesting Officer*    *Director of Patents and Trademarks*